United States Patent [19]

Bourrieres et al.

[11] Patent Number: 5,194,850
[45] Date of Patent: Mar. 16, 1993

[54] PROCESS FOR METERING ELECTRICAL ENERGY AND DEVICE FOR CARRYING OUT THE PROCESS

[75] Inventors: Pierre Bourrieres, Cahors; Jean-Paul Berry, Toulouse, both of France

[73] Assignee: Manufacture d'Appareillage Electrique de Cahors, Cahors, France

[21] Appl. No.: 671,703

[22] PCT Filed: Jul. 27, 1990

[86] PCT No.: PCT/FR90/00571
§ 371 Date: Apr. 3, 1991
§ 102(e) Date: Apr. 3, 1991

[87] PCT Pub. No.: WO91/02255
PCT Pub. Date: Feb. 21, 1991

[30] Foreign Application Priority Data

Aug. 4, 1989 [FR] France .................. 89 10549

[51] Int. Cl.⁵ .................................. G08B 21/00
[52] U.S. Cl. .......................... 340/660; 340/662; 364/483; 324/127; 324/142
[58] Field of Search ............... 340/657, 662, 661, 660; 324/98, 99 D, 117 R, 127, 142; 364/483

[56] References Cited

U.S. PATENT DOCUMENTS 4,282,576 8/1981 Elms et al. .................... 364/483
4,351,028 9/1982 Peddie et al. ................. 364/483

FOREIGN PATENT DOCUMENTS 379140 8/1964 Sweden .

*Primary Examiner*—Jin F. Ng
*Assistant Examiner*—Jeffery A. Hofsass
*Attorney, Agent, or Firm*—Young & Thompson

[57] ABSTRACT

A process for metering electric power passing via a certain point in a single-phase system comprises current (12) and voltage (U) stages at that point in the system and a processing stage for this information to generate data on the measurement of electric power. Each current data acquisition stage comprises the following steps: A) injection, into a winding (10a) of a magnetic circuit (10) with a predetermined structure surrounding one (LA) of the lines (LA, LB) of the system, of a current (I1+Ic) substantially proportional to the sum of a modulation current (kI1) and a "compensation" current (kIc); and B) detection at the terminals of the winding (10a) of an overvoltage leading to the immediate acquisition of the compensation current (kIc) as an image of the current passing through the line (LA). Use in the electronic metering of power in domestic installations, especially with facilities for remote transmission and information.

21 Claims, 2 Drawing Sheets

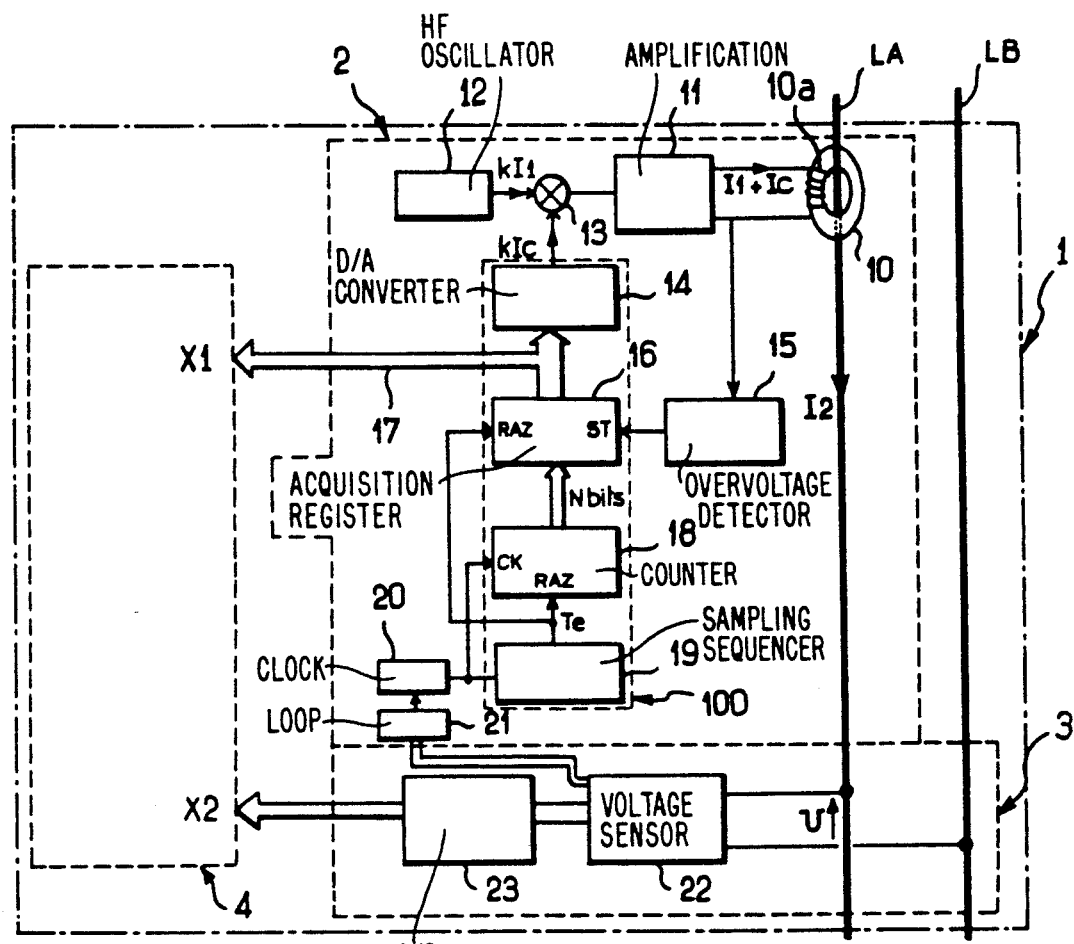
FIG._1
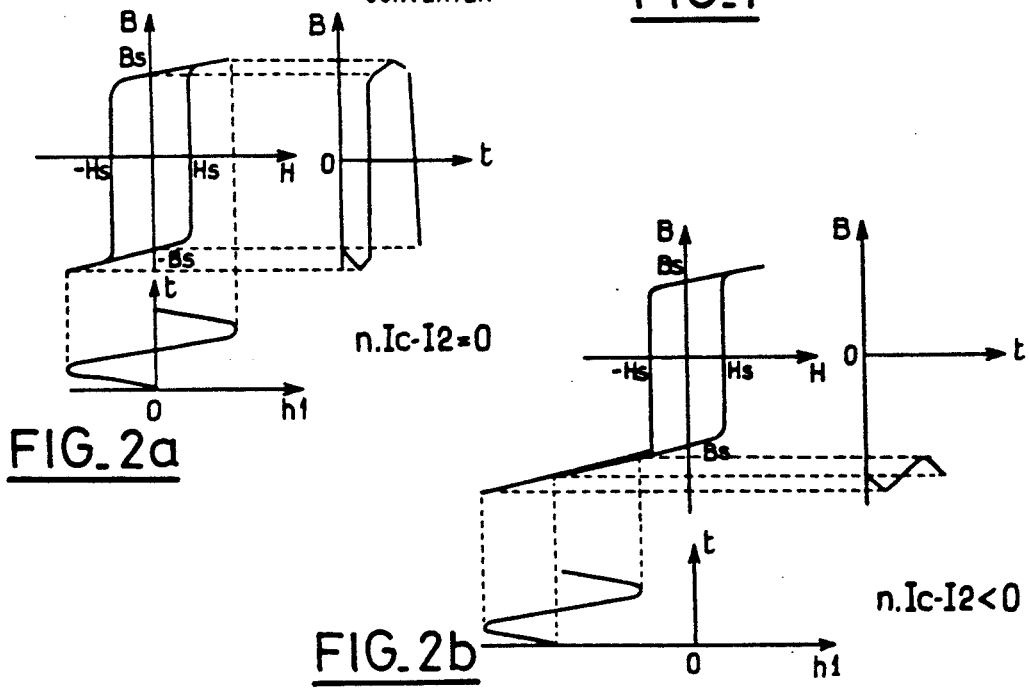
FIG._2a
FIG._2b

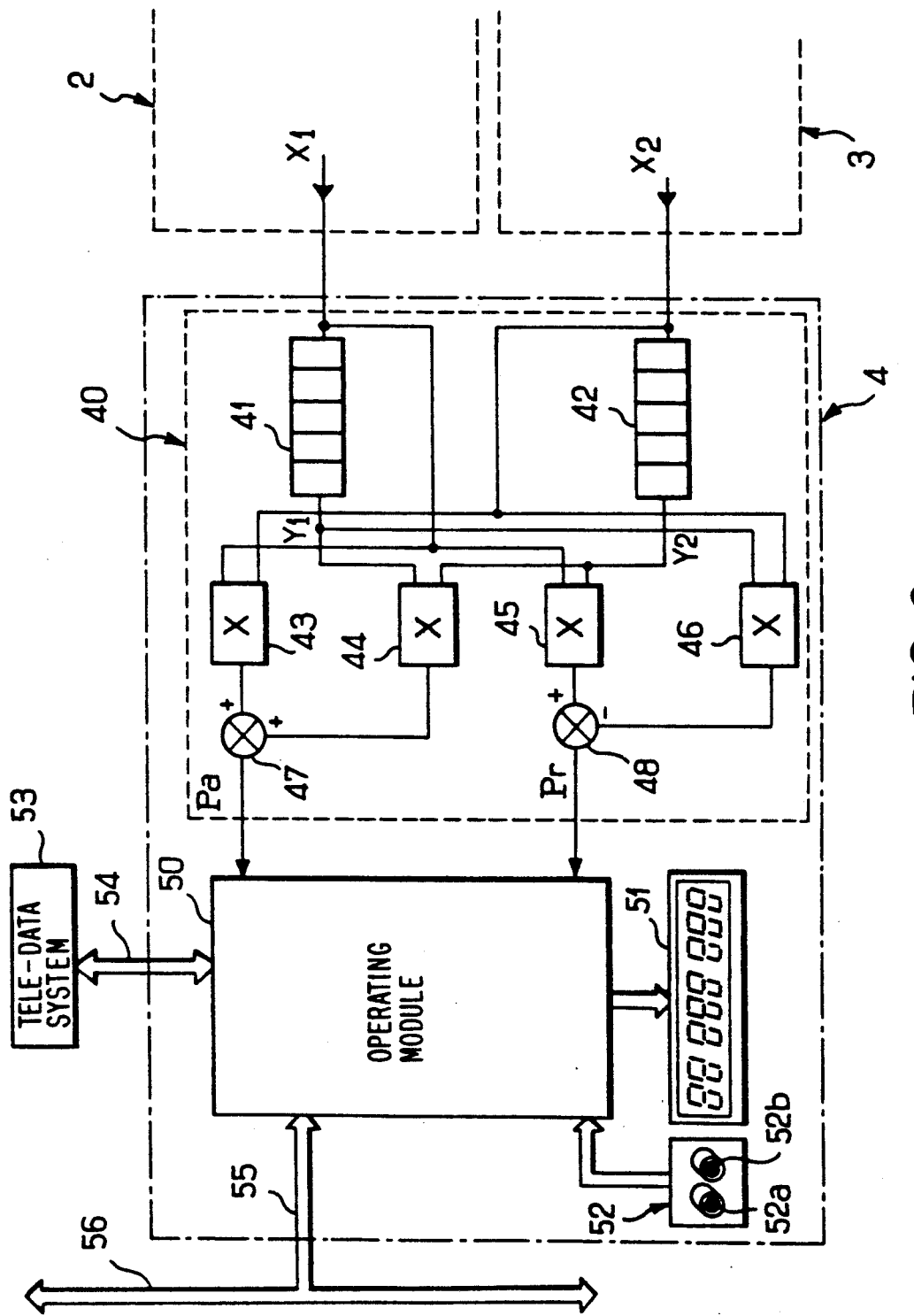
FIG_3

10

PROCESS FOR METERING ELECTRICAL ENERGY AND DEVICE FOR CARRYING OUT THE PROCESS

FIELD OF THE INVENTION

The present invention relates to a process for metering electrical energy. It is also concerned with devices for carrying it out.

BACKGROUND OF THE INVENTION

There are already known electromechanical processes for metering electrical energy which are employed in the electricity meters of millions of subscribers to the public electricity service.

However, these electromechanical processes which have shown substantial proof of efficiency and reliability have the disadvantage that they require costly and bulky devices.

Furthermore, there are known processes for measuring electrical power which make use of techniques involving the separate measurement of the current and voltage, for example in a single-phase installation. In some of these known processes, the instantaneous voltage and current, after being measured and put into the appropriate shape, are multiplied by analog means.

The voltage taken directly from the installation or from the secondary winding of an isolating transformer is usually reduced so as to reach a signal level compatible with the input levels of an integrated multiplier circuit. The current can be measured either by means of a shunt, this being the most common technique, or by using a current transformer or employing a Hall-effect sensor.

In the first two cases, namely a shunt or a transformer, the main handicap is the bulk and weight of the installation. The use of a Hall-effect sensor adopting the known flux compensation technique solves any problem of galvanic isolation, especially difficult when a shunt is used, but is truly justified only in uses where an acquisition speed below a microsecond is necessary, because it has the disadvantage of employing devices which are complex and costly and which supply low-level output voltages.

Some of the processes for measuring power and energy employing the abovementioned measuring techniques make use, furthermore, of a digitization of the respective analog voltage and current signals, thus allowing a digital processing of the corresponding information. However, these processes, although of higher performance as regards the processing than the purely analog processes, nevertheless involve devices which are at least as costly and bulky because of the sensors, especially current sensors, used.

OBJECT OF THE INVENTION

The object of the present invention is to overcome these disadvantages by providing a process for metering electrical energy passing at a specific point of a single-phase network, comprising the simultaneous steps of periodic acquisition of respective current and voltage information at the said network point and a step of processing the said information in order to generate an information item on the measurement of electrical energy from the said current and voltage information.

SUMMARY OF THE INVENTION

According to the invention, each step of acquiring the current information comprises the following steps:

A/ the introduction into a winding of a magnetic circuit of predetermined structure surrounding one of the lines of the network of a current substantially proportional to the sum of a modulating current of a predetermined high frequency and of a so-called compensating current, B/ the detection at the terminals of the said winding of an overvoltage at the said predetermined high frequency, the detection of an overvoltage leading to an acquisition of the said compensating current as an image of the current circulating in the said line, the said compensating current being controlled in such a way that the current introduction step A/ leads systematically to an overvoltage detection.

Thus, with the process according to the invention, the metering of electrical energy, carried out by the use of a high-frequency current modulation, requires only a magnetic circuit of small size in relation to that which would be needed for a current acquisition at the mains frequency.

Furthermore, the use of a compensating technique combined with the abovementioned modulation makes it possible directly to obtain an image of the current circulating in the line.

In an advantageous embodiment of the invention, the step of acquiring the current information comprises, furthermore, an amplification step preceding the current introduction step, and the compensating current is generated during a synthesis step and is then added to the modulating current during a summing step.

The purpose of this is, of course, to handle only currents of very low intensity, as compared with that of the currents actually present in the electrical installation. Moreover, in the process according to the invention, the change of the compensating current is controlled, whether in an increasing or a decreasing mode, during a synthesis step.

In a preferred version of the invention in its abovementioned embodiment, the synthesis step comprises:

a step of the digital counting of pulses of a predetermined clock frequency, the said counting being initiated at predetermined sampling moments in synchronism with the network voltage information and generating a counting information item, a step of converting the said counting information item into an analog information item representing the compensating current, the acquisition of the compensating current, which is an image of the current circulating in the line, being carried out directly in digital form in response to an overvoltage detection.

As a result of this digitization of the control of the compensating current, it is possible to obtain a direct digital image of the current circulating in the line, without the need to use an analog/digital converter, this having a major advantage over the use of a Hall-effect sensor which, intrinsically supplying an analog quantity, necessarily has to be associated with an analog/digital converter, if there is to be the possibility of having a digital image of the current so as subsequently to carry out a digital processing of this.

According to another aspect of the invention, there is provided a device for metering electrical energy passing at a specific point of a single-phase network, using the above-mentioned process comprising means of acquisition of information on the current circulating in a line of the network, means of acquisition of information on the voltage between the lines of the network, and means for processing the said voltage and current information in order to generate an information item on the measurement of electrical energy from the said voltage and current information.

This device is characterized in that the means of acquisition of current information comprise:

means for introducing into a winding of a magnetic circuit of predetermined structure surrounding one of the lines of the network a current substantially proportional to the sum of a modulating current of predetermined high frequency and of a compensating current, means for detecting an overvoltage at the said predetermined high frequency at the terminals of the said winding, and means for acquiring the value of the compensating current in the event of the detection of an overvoltage, the said compensating current being controlled by synthesis means in such a way that there is systematically an overvoltage detection.

BRIEF DESCRIPTION OF THE DRAWINGS

Other particular features and advantages of the invention will also emerge from the following description. In the accompanying drawings given by way of non-limiting examples:

FIG. 1 is a diagrammatic general view of an energy meter according to the invention, in which the current measurement and acquisition part is detailed more particularly;

FIGS. 2a and 2b illustrate the operating principle adopted in the measurement of the current and corresponding respectively to the linear and the saturated states of the magnetic torus used for measuring the current;

FIG. 3 is a diagrammatic view of the processing part of the energy meter according to the invention.

DETAILED DESCRIPTION OF THE INVENTION

There will now be described a preferred embodiment of an energy-metering device employing the process according to the invention which will be described at the same time as the device.

Referring to FIG. 1, the device for metering electrical energy according to the invention comprises a part 2 for the acquisition of information on the current I2 circulating in a line LA of a single-phase network comprising two lines LA, LB, a part 3 for the acquisition of information on the voltage U between the two lines LA, LB, and a part 4 for processing the current and voltage information in order to supply the resulting energy and power information.

The part 2 for the acquisition of current information comprises a magnetic torus 10 of very small size (for example, a diameter of 1 cm), surrounding a line of the network, for example the line LA. This magnetic torus 10 produced from a magnetic material of very high permeability, such as a ferrite material, comprises an exciting winding 10a, into which a current I1+IC is introduced from an amplification module 11. This amplification module 11 receives at its input a control signal obtained by the summing in a summing device 13 of a modulating current kI1 obtained from a high-frequency (HF) oscillator 12 and of a so-called compensating current kIc supplied by a digital/analog converter 14. The synthesis of the compensating current kIc is carried out by a synthesis module 100 comprising a sampling sequencer 19, with which a sampling period Te is associated and which is controlled by a clock 20, a pulse counter 18 initiated by the sequencer 19 and at its clock input CK receiving the pulses obtained from the clock 20, and an acquisition register 16 ensuring the acquisition of the output information from the counter 18 in the form of N bits, when its acquisition control input ST is activated, and having a reinitiating input RAZ. The acquisition control input ST is connected to the output of a high-frequency (HF) overvoltage detector 15, the input of which is connected to the winding 10a of the magnetic torus 10, whilst the reinitiating input RAZ is connected to the output of the sampling sequencer 19.

The output of the acquisition register 16 is applied to the input of the digital/analog converter 14, but also supplies a digital current information item X1 to the processing part 4 along the bus 17.

The part for the acquisition of the voltage information 3 comprises a voltage sensor module 22 comprising, for example, a second magnetic torus functioning as a lowering and isolating transformer (not shown) and an analog/digital converter 23 which supplies a digital voltage information item X2 to the processing part 4. The clock 20 is preferably synchronized with the mains by known techniques, for example by means of a phase-locked loop circuit 21 connected to the sensor module 22.

The current-measuring process used in the invention will now be described with reference to FIGS. 1, 2a and 2b. This process is based on the fact that the voltage response of a magnetic circuit subjected to a controlled-current feed of its winding differs radically, depending on whether the mean value of the current wave is substantially zero or much higher than the value of the current corresponding to the coercive field of the magnetic material at the frequency used. The idea is to make use of a current input at high frequency, at all events much higher than the mains frequency, in order to obtain a significant voltage response.

Thus, when the mean value of the current wave introduced into the winding 10a, and therefore of the magnetic field h1 in the magnetic circuit 10, since this circuit is closed, is substantially zero or varies only very slightly round the zero value on the scale of one electrical period of the network, with reference to FIG. 2a, the magnetic induction excursion B is greater than 2Bs, if Bs is the saturation induction of the material and if the amplitude of the field h1 is higher than that of the coercive field Hs.

This pronounced excursion into a zone of high permeability results in a significant overvoltage at the terminals of the winding 10a, which is then detected by the HF overvoltage detector 15.

This situation occurs when there is a compensation of the ampere turns at low frequency, namely on the one hand those generated by the line current I2 and on the other hand those generated by the amplified compensating current Ic circulating in the turns numbering n of the winding 10a.

Thus, in a compensating situation:

$$n \cdot Ic - I2 = 0 \qquad (1)$$

In contrast, when there is no compensation, for example when $$n \cdot Ic - I2 < 0 \quad (2)$$

with reference to FIG. 2b, the magnetic induction excursion B is then very low in comparison with the excursion obtained in the compensating situation, because the material is in a highly saturated state. This results in a low voltage generated at the terminals of the winding 10a and non-activation of the overvoltage detector 15.

It will therefore easily be appreciated that, when an overvoltage is detected, the instantaneous compensating current Ic is a direct image of the current to be measured I2, apart from a proportional factor which is equal to the number n of turns of the winding 10a.

The synthesis of the compensating current before amplification kIc takes place as follows:

The clock 20 generates pulses at a high frequency, at all events much higher than the sampling frequency which, by way of example, can be equal to 1 kHz. The sampling sequencer 19 executes a frequency division on the basis of the clock signal, so as to generate a sampling signal of period Te, for example equal to 1 ms, intended for the RAZ inputs of the counter 18 and the acquisition register 16, thus resulting, for example, in the acquisition of 20 samples per period of the mains.

In response to an initiation command, the counter 18 generates at its output a digital "ramp" on N bits which, via its acquisition register 16, is converted into an analog ramp by the digital/analog converter 14. In practice, N can be equal to 8 or 12, depending on the requisite accuracy. This analog ramp of positive slope is in fact the compensating current kIc which is then added to the HF modulating current kI1, the frequency of which is at all events very high in relation to the limiting frequency of the frequency spectrum of kIc. An HF-modulated current ramp is therefore introduced into the winding 10a closely coupled to the line conductor LA.

As soon as the abovementioned equality (1) is obtained (compensation), the acquisition register 16 locks the digital information X1 representing the compensating current and therefore the current circulating in the line LA.

Moreover, the compensating current kIc is controlled in such a way that the current introduction step leads systematically to an overvoltage detection. This condition is obtained, in practice, due to the fact that the sampling sequencer periodically ensures the resetting of the pulse counter 18 and therefore thereby generates a compensating current of which the wave form is "sawtooth". It is possible, furthermore, by means of the overvoltage detector 15 which is preferably a synchronous detector, to provide a sign detection and to control the sign of the compensating current ramp as a function of the detected sign of the magnetic field in the circuit 10.

A special embodiment shown in FIG. 3 will now be described. The processing part 4 consists mainly of a calculation module 40 and of an operating module 50.

The digital words which are respective images of the current X1 and the voltage X2 and which are obtained at each sampling period are stored in a stack of the FIFO (first in-first out) type 41, 42, the function of which is to obtain a controlled phase shift of the applied information, in this particular case equal to n/2.

In this case, the size of the stack 41, 42 is determined by the relation $$n = T/(4 \cdot Te) \text{bits} \quad (3)$$

if T is the period of the mains.

Each input sample X1, X2 can therefore have associated with it the sample (Y1, Y2) acquired ¼ mains period before.

It is easy to show that the active power Pa and the reactive power Pr recorded at the measuring point of the network can be expressed on the basis of the instantaneous and the delayed sampled current and voltage information X1, X2 and Y1, Y2 respectively by the following relations:

$$Pa = X1 \cdot X2 + Y1 \cdot Y2 \quad (4)$$

$$Pr = X1 \cdot Y2 - Y1 \cdot X2 \quad (5)$$

To carry out these multiplication and addition operations, the calculation module 40 comprises four multipliers 43, 44, 45, 46 respectively supplying the products X1·X2, Y1·Y2, X1·Y2, X2·Y1, and two summing devices 47, 48 respectively supplying the sum X1·X2+Y1·Y2 and the difference X1·Y2−Y1·X2. The operations are of course completely digital and for each sampling period Te supply the digital active power information Pa and reactive power information Pr to the operating module 50.

The operating module 50, preferably organized round a processor, subsequently performs the well-known functions of filtering, integration and spectrum analysis and carries out statistics processing.

Moreover, the integration function applied to the active power makes it possible to obtain the electrical energy consumption.

The operating module 50 makes it possible to display this information on indicators 51, and this can be controlled from buttons 52 which select, for example, the type of information (energy, power, statistical information) 52a or scroll this information 52b.

The operating module 50 also ensures the interface between the metering device and a tele-data system 53 by means of a connecting bus 54 which can be a series bus of the type RS232C well-known to an average person skilled in the art.

This arrangement makes it possible to carry out a remote programming of the programming means and a display of the main information on a remote console.

Moreover, the energy-metering device 1 can preferably be connected to a common tele-transfer bus 55, 56, the effect of this being to make the reading of the energy meters more efficient and to obtain a considerable reduction in the management costs for the energy distributor.

The acquisition, processing and operating parts as a whole can be provided within an integrated circuit for a specific use of the ASIC type, of course with the exception of toric circuits which, however, have a very small bulk (a diameter smaller than 1 cm). This can result in a total volume of the meter within a single housing which is less than 10 cm$^3$, with very low series production costs.

The electrical supply necessary for the integrated circuit can be tapped downstream of the toric voltage supply circuit or from an independent energy source, such as a cell or battery.

There is therefore a device for metering electrical energy which is compact and inexpensive and ensures galvanic isolation, is remotely controllable and allows a tele-transfer and which, furthermore, has the advantage of not including a low-level analog measuring stage, thus resulting in an increased reliability of the energy measurements.

Of course, the invention is not limited to the examples described, and many modifications can be made to these examples, without departing from the scope of the invention.

Thus, the set of functions is not necessarily integrated in a single circuit, but separate circuits can be provided for the acquisition and the processing. The bit size of the acquired samples can be higher than 12 and correspond to future developments as regards the capacity of integrated circuits and the power of the processors available on the market in future.

A more detailed sampling can also be considered by increasing the sampling frequency, for example in the presence of wave forms which have high distortion or which are seriously disturbed.

Moreover, many modifications can be made to the tele-transfer and tele-data functions in the light of the foreseeable development of communication techniques, without departing from the scope of the invention.

We claim:

1. A process for metering electrical energy passing at a specific point of a single-phase network, comprising acquiring current and voltage information at the said network point and processing the said information in order to generate an information item on the measurement of electrical energy, wherein the acquisition of the current information comprises the following steps:

A/ the introduction into a winding (10a) of a magnetic circuit (10) surrounding one (LA) of the lines (LA, LB) of the network of a current (I1+Ic) substantially proportional to the sum of a modulating current (kI1) of a predetermined high frequency and of a compensating current (kIc), B/ the detection at said winding (10a) of an overvoltage at the said predetermined high frequency, the detection of an overvoltage leading to an immediate acquisition of the said compensating current (kIc) as a measure of the current in the said line, the said compensating current (kIc) being controlled in such a way that the current introduction step A/- leads systematically to an overvoltage detection.

2. The process according to claim 1, wherein the step of acquiring the current information comprises, furthermore, an amplification step preceding the current introduction step, and wherein the compensating current (kIc) is generated during a synthesis step and is then added to the modulating current (kI1) during a summing step.

3. The process according to claim 2, wherein the synthesis step comprises a step of digital counting of pulses of a predetermined clock frequency, the said counting being initiated at predetermined sampling moments in synchronism with the voltage information and generating a counting information item, a step of converting the said counting information item into an analog information item representing the compensating current (kIc), the acquisition of the compensating current (kIc) as a measure of the current in the line, being carried out directly in digital form (X1) in response to an overvoltage detection.

4. The process according to claim 3, wherein the step of acquiring the voltage information leads to providing digital information (X2) on the voltage of the network at the said predetermined sampling moments, and wherein the processing step comprises:

simultaneous steps of respective storage of the digital current (X1) and voltage (X2) information, designed in such a way that the said digital information is restored at the end of a delay time equal to a quarter of one electrical period of the network, at each sampling moment, simultaneous steps of calculating the respective products:
   of the instantaneous current (X1) and voltage (X2) information,
   of delayed current (Y1) and voltage (Y2) information,
   of the respective instantaneous voltage (X2) and delayed current (Y1) information,
   of the respective instantaneous current (X1) and delayed voltage (Y2) information;

simultaneous steps of summing the product (X1·X2) of the instantaneous current and voltage information and the product (Y1·Y2) of the delayed current and voltage information and of finding the difference between the product (Y1·X2) of the instantaneous voltage and delayed current information and the product (X1·Y2) of the instantaneous current and delayed voltage information, for the purpose of respectively supplying digital information on the active power (Pa) and reactive power (Pr).

5. The process according to claim 4, wherein the processing step comprises, furthermore, an integration step for generating from the digital power information (Pa) an information item on the energy passing at the specific point of the network.

6. A device (1) for metering electrical energy passing at a specific point of a single-phase network, comprising means (2) of acquisition of information on the current in a line (LA) of the network, means (3) of acquisition of information on the voltage between the lines (LA, LB) of the network, and means (4) for processing the said voltage and current information in order to generate an information item on the measurement of electrical energy from the said voltage and current information, wherein the means (2) of acquisition of current information comprise:

means (11) for introducing into a winding (10a) of a magnetic circuit (10) surrounding one (LA) of the lines (LA, LB) of the network a current (I1+Ic) substantially proportional to the sum of a modulating current (kI1 of predetermined high frequency and of a compensating current (kIc), means (15) for detecting an overvoltage at the said predetermined high frequency at said winding, and means (16, 17) for acquiring the value of the compensating current (kIc) in the event of the detection of an overvoltage, the said compensating current being controlled by synthesis means (100) in such a way that there is systematically an overvoltage detection.

7. A device (1) according to claim 6, wherein introduction means comprise means (11) for amplifying a current signal obtained from summing means (13) which at its input receive, the modulating current (kI1) generated by oscillator means (12) at the predetermined high frequency and, the compensating current (kIc) obtained from the synthesis means (14, 16, 18, 19, 20).

8. A device (1) according to claim 7, wherein the synthesis means (100) comprise means (18) for the digital counting of pulses generated by clock means (20) which is of a predetermined frequency, register means (16) which at the input receive digital counting information obtained from the said counting means (18) and the output of which is applied to digital/analog conversion means (14) for generating an analog signal of the digital counting information in the form of the compensating current (kIc), and sampling sequencer means (19) connected to the clock means (20) for initiating the said counting (18) and register (16) means at predetermined sampling moments, the said register means (16) being controlled by the overvoltage detection means (15) and, in the event of detection, storing an information item (X1) in digital form representing the current (I2) in the line.

9. A device (1) according to claim 8, wherein the clock means (20) are synchronized with the network voltage by phase-locked loop means (21) connected to the means (22) of acquisition of the voltage information.

10. Device (1) according to claim 6 wherein the overvoltage detection means (15) comprise synchronous detection means.

11. Device (1) according to claim 6, wherein, at the predetermined sampling moments, the processing means (4) receive respective digital current (X1) and voltage (X2) information obtained respectively from the means (2, 3) of acquisition of current and voltage information, and wherein they comprise means (40) for calculating respective information on active power (Pa) and reactive power (Pr) and means (50) for operating on the said power information (Pa, Pr), especially for the purpose of generating the electrical energy measurement information.

12. Device (1) according to claim 11, wherein the calculation means (40) comprise stack means (41, 42) of a "first in-first out" type, designed in such a way that the stack means supply respective delayed current (Y1) and voltage (Y2) information with a delay substantially equal to a quarter of the electrical period of the network from the respective instantaneous current (X1) and voltage (X2) information supplied at each predetermined sampling moment.

13. Device (1) according to claim 12, wherein the calculation means (40) comprise, furthermore, multiplier means (43, 44, 45, 46) for obtaining, at each sampling moment, respectively the following first, second, third and fourth products (X1·X2, Y1·Y2, X1·X2, Y1·X2)

of the respective instantaneous current (X1) and voltage (X2) information;

of the respective delayed current (Y1) and voltage (Y2) information;

of the instantaneous current information (X1) and the delayed voltage information (Y2);

of the delayed current information (Y1) and the instantaneous voltage information (X2), means (47) for summing the said first (X1·X2) and second (Y1·Y2) products, and means (48) for substracting the said third product (X1·Y2) from the said fourth product (Y1·X2), the said summing means (47) and subtraction means (48) respectively supplying respective digital information on active power (Pa) and reactive power (Pr).

14. Device (1) according to claim 13, wherein the operating means (50) comprise digital integration means for supplying, from the information on active power (Pa) and reactive power (Pr), an information item on the measurement of electrical energy passing at the specific point of the network.

15. Device (1) according to claim 11, wherein the operating means (50) are connected to a tele-transfer bus (55, 56).

16. Device (1) according to claim 11, wherein the operating means (50) are connected to tele-data means (53) by means of a connecting bus (54).

17. Device (1) according to claim 11, wherein the processing means (4) comprise means (51) for displaying information calculated by the operating means (50).

18. Device (1) according to claim 11, wherein the processing means (4) are grouped within a single integrated circuit.

19. Device (1) according to claim 6, wherein the magnetic circuit (10) has a toric structure of a diameter preferably less than or equal to one centimeter, and wherein the device as a whole is contained in a single housing of a volume preferably less than ten cubic centimeters.

20. Device (1) according to claim 6, wherein the magnetic circuit (10) is produced from a material of very high permeability.

21. Device according to claim 6, comprising, furthermore, means of independent electrical supply for tapping from the said network the energy necessary for feeding the means forming the device (1).

* * * * *